(12) United States Patent
Ghaemi et al.

(10) Patent No.: US 9,564,056 B1
(45) Date of Patent: Feb. 7, 2017

(54) FLIGHT PATH OPTIMIZATION USING NONLINEAR PROGRAMMING

(71) Applicant: General Electric Company, Schenectady, NY (US)

(72) Inventors: Reza Ghaemi, Niskayuna, NY (US); Eric Richard Westervelt, Niskayuna, NY (US); Mark Darnell, Grand Rapids, MI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 14/844,892

(22) Filed: Sep. 3, 2015

(51) Int. Cl.
| | |
|---|---|
| G06F 7/70 | (2006.01) |
| G06F 19/00 | (2011.01) |
| G08G 5/00 | (2006.01) |
| G05D 1/04 | (2006.01) |
| G06F 17/50 | (2006.01) |
| G06F 17/10 | (2006.01) |

(52) U.S. Cl.
CPC ............ G08G 5/0095 (2013.01); G05D 1/042 (2013.01); G06F 17/10 (2013.01); G06F 17/5009 (2013.01); G08G 5/003 (2013.01)

(58) Field of Classification Search
USPC ........ 701/3, 5, 14; 244/75.1, 180, 76 R, 175
See application file for complete search history.

(56) References Cited

U.S. PATENT DOCUMENTS

| | | | |
|---|---|---|---|
| 5,908,176 A | 6/1999 | Gilyard | |
| 6,134,500 A | 10/2000 | Tang et al. | |
| 8,157,205 B2 * | 4/2012 | McWhirk | ................ B64B 1/02 212/274 |
| 8,645,009 B2 | 2/2014 | Klooster | |

(Continued)

FOREIGN PATENT DOCUMENTS

CN        104309822 A        1/2015

OTHER PUBLICATIONS

Optimize the flight path for airlines using real-time information;Jin-Ru Yen; 2015 IEEE International Conference on Automation Science and Engineering (CASE); Year: 2015; pp. 1649-1649, DOI: 10.1109/CoASE.2015.7294337.*

(Continued)

*Primary Examiner* — Cuong H Nguyen
(74) *Attorney, Agent, or Firm* — Buckley, Maschoff & Talwalkar LLC

(57) ABSTRACT

A method, medium, and system to receive a mathematical model representation of performance characteristics for an aircraft and an engine combination; perform a projection based model order reduction on the mathematical model representation; eliminate, based on the projected model, fast dynamics components of the mathematical model representation; determine a reduced order model, as a differential algebraic equation, wherein algebraic equations replace the fast dynamics; set a flight path angle and a throttle level angle as a control to minimize fuel consumption for the modeled aircraft and engine combination; discretize equa- (Continued)

tions of motion for the modeled aircraft and engine combination and formulate optimization equations as a nonlinear programming problem; and determine an optimal open loop control that minimizes fuel consumption for the modeled aircraft and engine combination to climb to a prescribed cruise altitude and airspeed.

18 Claims, 4 Drawing Sheets

(56) References Cited

U.S. PATENT DOCUMENTS

| | | | |
|---|---|---|---|
| 8,655,589 B2 | 2/2014 | Grover et al. | |
| 8,825,237 B2 | 9/2014 | Covington et al. | |
| 8,880,247 B2 | 11/2014 | Luckner et al. | |
| 8,954,262 B2 | 2/2015 | Sawhill et al. | |
| 2009/0152391 A1* | 6/2009 | McWhirk | B64B 1/02 244/30 |
| 2010/0270422 A1* | 10/2010 | Karem | B64C 27/08 244/17.13 |
| 2010/0318295 A1* | 12/2010 | Flotte | G08G 5/0021 701/301 |
| 2015/0154873 A1* | 6/2015 | Sawhill | G08G 5/0013 701/122 |

OTHER PUBLICATIONS

Similarity-based modeling of aircraft flight paths; J. Mott; M. Pipke; Aerospace Conference, 2004. Proceedings. 2004 IEEE Year: 2004, vol. 3; pp. 1593 vol. 3, DOI: 10.1109/AERO.2004.1367933.*
Energy-optimal path planning for six-rotors on multi-target missions; Kevin Vicencio; Tristan Korras; Kenneth A. Bordignon; Iacopo Gentilini; Intelligent Robots and Systems (IROS), 2015 IEEE/RSJ International Conference on; Year: 2015; pp. 2481-2487, DOI: 10.1109/IROS.2015.7353714.*
Ngo, Anhtuan D. "A Fuel-Optimal Trajectory for a Constrained Hypersonic Vehicle Using a Direct Transcription Method", 2004, IEEE Aerospace Conference Proceedings, (pp. 2704-2709, 6 total pages).
Calise, A.J. et al., Trajectory Optimization and Guidance Law Development for National Aerospace Plane Applications, TP5-2:00, American Control Conference, Jun. 15-17, 1988, (pp. 1406-1411, 6 total pages).

* cited by examiner

200

```
┌─────────────────────────────────────────────────┐
│ RECEIVE A MATHEMATICAL MODEL REPRESENTATION OF  │
│ PERFORMANCE CHARACTERISTICS FOR AN AIRCRAFT AND AN │
│ ENGINE COMBINATION                          205 │
└─────────────────────────────────────────────────┘
                         ▼
┌─────────────────────────────────────────────────┐
│ PERFORM A PROJECTION ON THE MATHEMATICAL        │
│ MODEL REPRESENTATION                            │
│                                             210 │
└─────────────────────────────────────────────────┘
                         ▼
┌─────────────────────────────────────────────────┐
│ ELIMINATE, BASED ON THE PROJECTED MODEL, FAST DYNAMICS │
│ COMPONENTS OF THE MATHEMATICAL MODEL REPRESENTATION │
│                                             215 │
└─────────────────────────────────────────────────┘
                         ▼
┌─────────────────────────────────────────────────┐
│ DETERMINE A REDUCED ORDER MODEL, AS A DIFFERENTIAL │
│ ALGEBRAIC EQUATION, WHEREIN ALGEBRAIC EQUATIONS │
│ REPLACE THE FAST DYNAMICS                   220 │
└─────────────────────────────────────────────────┘
                         ▼
┌─────────────────────────────────────────────────┐
│ SET A FLIGHT PATH ANGLE AND A THROTTLE LEVEL ANGLE AS │
│ A CONTROL TO MINIMIZE FUEL CONSUMPTION FOR THE  │
│ MODELED AIRCRAFT AND ENGINE COMBINATION     225 │
└─────────────────────────────────────────────────┘
                         ▼
┌─────────────────────────────────────────────────┐
│ DEFINE A CLIMB TERMINAL COST AS A FUNCTION OF CRUISE │
│ ALTITUDE AND AN AIRSPEED                        │
│                                             230 │
└─────────────────────────────────────────────────┘
                         ▼
┌─────────────────────────────────────────────────┐
│ DISCRETIZE EQUATIONS OF MOTION FOR THE MODELED  │
│ AIRCRAFT AND ENGINE COMBINATION AND FORMULATE   │
│ OPTIMIZATION EQUATIONS AS A NONLINEAR           │
│ PROGRAMMING PROBLEM                         235 │
└─────────────────────────────────────────────────┘
                         ▼
┌─────────────────────────────────────────────────┐
│ DETERMINE AN OPTIMAL OPEN LOOP CONTROL THAT MINIMIZES │
│ FUEL CONSUMPTION FOR THE MODELED AIRCRAFT AND   │
│ ENGINE COMBINATION TO CLIMB TO A PRESCRIBED     │
│ CRUISE ALTITUDE AND AIRSPEED                240 │
└─────────────────────────────────────────────────┘
```

FLIGHT PATH OPTIMIZATION USING NONLINEAR PROGRAMMING

BACKGROUND

The present disclosure relates to aircraft flight path optimization and, in particular, to generating optimal climb control trajectories using nonlinear programming.

A flight management system (FMS) is a computer-based system on-board an aircraft that performs a number of in-flight tasks, including in-flight management of a flight plan. FMSs have been in use for many years, and the programming techniques used by FMSs heretofore are designed for the computing capabilities of prior generations of computerized systems. For example, prior FMSs still in service today typically make assumptions regarding many of the complex and varied parameters regarding a flight path, including but not limited to fixed (i.e., constant) values for aspects regarding the aircraft and its performance characteristics and a constant value for aircraft operations such as, for example, a constant aircraft speed during a climb portion of flight. Such FMSs typically assume a constant speed (not a real-world constraint) during a climb portion of the flight path and rely on lookup tables to determine the constant climb speed to report to a given cruising altitude and velocity.

Therefore, there exists a desire to provide a system and process that can generate control trajectories based on actual conditions for particular flights as opposed to assumed constraints, including optimized flight paths.

DRAWINGS

These and other features, aspects, and advantages of the present disclosure will become better understood when the following detailed description is read with reference to the accompanying drawings in which like characters represent like parts throughout the drawings, wherein:

FIG. 2 is an illustrative flow diagram of a process, in accordance with one or more embodiments shown or described herein;

DETAILED DESCRIPTION

The present disclosure relates to guidance optimization using nonlinear programming. As used herein, the term nonlinear programming is the process of solving an optimization problem defined by a system of equalities and inequalities, collectively termed constraints, over a set of unknown real variables, along with an objective function to be maximized or minimized, where some of the constraints or the objective function are nonlinear. It is the sub-field of mathematical optimization that deals with problems that are not linear. As used herein, the term guidance defines the control reference that minimizes a cost function and that is the input to a feedback control system. In some embodiments, the present disclosure discloses a method that determines an optimal open-loop control. A flight path may then be predicted by applying the determined control to the equations of motion given assumed initial operating states and environment conditions. In some aspects, the present disclosure particularly relates to a system and process to optimize a climb phase or portion of a flight path using nonlinear programming. In some aspects, nonlinear programming techniques may be leveraged to more accurately and efficiently define a flight path optimization problem and generate an optimal control trajectory. In some aspects, nonlinear programming may be used to solve a guidance optimization problem (e.g., minimizing fuel consumption) that is defined by a system of constraints over a set of unknown real variables. Previous endeavors and systems, including legacy FMSs, typically assume numerous variables are constant (e.g., aircraft mass assumed to be constant despite changes due to fuel burn, a mandate that aircraft airspeed be constant during a climb portion of a flight path, etc.) and/or otherwise do not consider some other variables. The use of nonlinear programming techniques and current computing capabilities in combination can provide a mechanism to address and generate a solution for the complicated nonlinear problem(s) of guidance optimization. In some aspects, processes and systems herein may eliminate or at least minimize the use of assumptions and other (arbitrary) constraints that are not realistic in determining an optimal control. Moreover, the proposed nonlinear programming can handle all types of constraints that the aircraft might be required to satisfy including: altitude-speed, altitude-distance and speed-distance constraints. As used herein, the term aircraft, airplane, or plane may include commercial aircraft as addressed in Title 14 of the Code of Federal Regulations part 25 (14 CFR part 25) containing rules for Airworthiness Standards: Transport Category Airplanes, drones, and other aerial vehicles.

Figure 1:
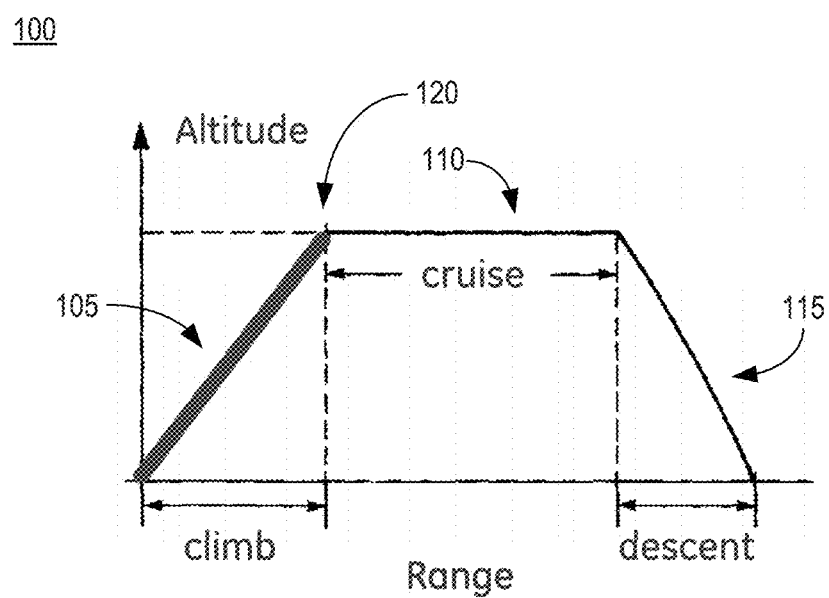
FIG. 1 is an illustrative depiction of the phases of a flight path, in accordance with one or more embodiments shown or described herein.

Referring to FIG. 1, illustrated in graph format is a flight path 100 for an aircraft. As shown, the flight path generally includes three phases or portions. In particular, shown in FIG. 1 is a flight path 100 that includes a climb path 105, a cruise path 110, and a descent path 115. The graph in FIG. 1 shows the general relationship between the altitude (vertical axis) and the range of an aircraft (horizontal axis) for a fixed wing aircraft. In some embodiments, the processes and systems disclosed herein may be adapted to determine an optimal control for the climb portion 105 of a flight path, wherein an objective of the optimization is to minimize fuel consumption during the climb portion of the flight path while satisfying the desired distance, altitude, speed for the start of the cruise phase of the flight path, and, without limit, other types of required flight path constraints. In some embodiments, aspects of the present disclosure may be extended to include, at least in part, the cruise 110 and/or descent 115 portions of a flight path.

Referring to FIG. 2, a process 200 related to determining an optimal control for an aircraft with a defined objective function is disclosed. In some embodiments, process 200 relates to determining a control trajectory for the climb path for a particular aircraft. In some embodiments, the problem of optimizing a climb path for an aircraft herein eliminates, lifts, or at least minimizes an extent of the operational constraints considered in determining the optimal control. It is noted that actual (i.e., real) operational constraints may exist and can be used in the determination of the optimal flight path. For example, real-world operational constraints such as, for example, a maximum speed at specific low altitudes, a governing entity's requirement for the aircraft to fly to certain waypoints, and other operational constraints can be fully accounted for in some processes herein, including but not limited to the process flow shown in FIG. 2.

In some embodiments, the problem of optimizing a flight path can be cast in the form of a nonlinear programming optimization problem. As such, all of the actual constraints of the problem may be considered using nonlinear programming. For example, constraints such as, for example, the particular aircraft flying the flight path, the particular engine(s) used with the aircraft, the particular airframe manufacturer and its associated characteristics for the flight path, regulatory-imposed flight restrictions, etc. may be accounted for in accordance with some embodiments herein. These and other constraints may be translated into nonlinear programming mathematical equations to determine the optimal solution, taking into account the realistic constraints without a need to impose unnecessary, unrealistic, or arbitrary constraints and/or assumptions.

In general, the optimization problem of some embodiments herein may be formalized by obtaining an accurate model of the relevant aircraft and its engine(s), imposing the real-world constraints on the problem, and determining a nonlinear programming solution for a desired optimization function (e.g., minimizing fuel consumption for a flight path).

Process 200 provides a process to generate an optimal control, in accordance with some embodiments herein. At operation 205, a mathematical model representation of performance characteristics for an aircraft and an engine combination is received. The mathematical model representation of performance characteristics for the aircraft and an engine combination herein accurately unifies the aircraft and engine model that is employed in a nonlinear programming solver that provides optimal flight path to increase fuel savings. As referred to herein, the mathematical model representation of performance characteristics for the aircraft and engine combination may include accurate engine models for each particular aircraft, accurate air dynamic models for each particular aircraft, engine degradation models (e.g., obtainable from engine manufacturers) for the particular engines used with a specific aircraft, fuel burn rates (e.g., as a function of altitude, velocity, throttle angel, etc.) for the specific aircraft, and other additional, substitute, or alternative actual (i.e., real-world) constraints.

In some embodiments, the mathematical model representation of performance characteristics for the aircraft and engine combination used in operation 205 may be derived or otherwise determined for an entity implementing at least some of the operations of process 200. The mathematical model may be derived prior to operation 205. In some embodiments, as part of operation 205 or as a separate operation, the mathematical model representation of performance characteristics for the aircraft and engine combination may be verified by a process of matching the model with flight substantiation data.

Operation 210 includes performing a projection on the mathematical model representation of operation 205. In some aspects, the full model is projected onto a vertical plane so that the model will only represent longitudinal motion (i.e., the relevant motion for the present flight path optimization). In this manner, the number of equations that will be needed to accurately and fully represent flight path can be reduced.

At operation 215, the fast dynamics components of the mathematical model as now represented by the model of operation 210 can be eliminated. At least some of the fast dynamics components of the model may be eliminated in an effort to reduce the computational load associated with process 200. In some embodiments, such as, for example some changes in the weight of the aircraft, changes in altitude, and changes in speed occur over a matter of minutes as compared to other changes (i.e., fast dynamics) that occur in the span of second(s). By eliminating these fast dynamics, an optimized control may be efficiently obtained while still maintaining a high degree of accuracy. Operations of 210 and 215 may constitute, at least I part, a model order reduction process.

Continuing to operation 220, a reduced order model is determined. The reduced order model comprises a (system of) differential algebraic equation(s) where the algebraic equations replace the fast dynamics. Operation 200 further includes operation 225 that includes setting or choosing a flight path angle and a throttle lever angle as a control to minimize fuel consumption for the modeled aircraft and engine combination.

In some embodiments, an altitude of the modeled aircraft and engine combination may be treated as the independent variable. Initially, in the mathematical model of the aircraft and engine combination, which is represented as differential algebraic equations, the derivative of states (variables) are with respect to time. In some embodiments, the independent variable is changed to altitude instead of time. Namely, all differentiations in the differential algebraic equations are done with respect to altitude. Consequently, all other variables, including time, are formulated as dependent variables on altitude in the mathematical model of aircraft. This treatment of the altitude may be possible since it is desirable for the aircraft to arrive at the terminal point of the climb (i.e., the start of the cruising phase of the flight path, reference point 120 in FIG. 1) at a specific altitude.

In some embodiments, the aircraft's performance and airspace limits may be defined as state and or control constraints for the optimization problem being solved by process 200. At operation 230, process 200 includes defining a climb terminal cost as a function of cruise altitude and airspeed. The cruise conditions are taken into account in the cost definition to capture the effect of flying in the cruise condition once the climb phase is passed. The cruise cost appears in the form of the terminal cost: –(fuel burnt at cruise condition per distance unit)*(total climb distance). With this term, the climb optimization is performed for all trajectories that travel the climb phase and part of the cruise phase such that all trajectories arrive at the same distance, altitude, and velocity at the cruise condition at some point close to the end of the climb. Accordingly, in some embodiments, a trajectory that flies the climb phase with minimal fuel consumption is not only determined but a trajectory also including some additional distance traveled that therefore burns fuel over the cruise phase to arrive at the same distance as other trajectories and once arrived at the same distance is determined. This type of trajectory will have consumed more fuel, relatively, than the trajectory only including the climb phase.

Proceeding to operation 235, the equations of motion for the modeled aircraft and engine combination (i.e., the full flight path equation of motion) can be discretized and formulated as a nonlinear programming problem with the objective of minimizing the fuel costs of the climb portion of the flight path. The embodiment of the nonlinear programming problem with the objective of minimizing the fuel costs of the climb portion of the flight path is a specific instance of a more general problem to minimize a Direct Operating Cost. The nonlinear programming problem of operation 235 may then be solved to determine an optimal open loop control that minimizes fuel consumption for the modeled aircraft and engine combination to climb to a prescribed cruise altitude and airspeed, as depicted at operation 240 in FIG. 2. The prescribed cruise altitude and airspeed may correspond to point at or about 120 in FIG. 1. In some embodiments, the flight trajectory can be determined from the optimal open loop control vehicle equations of motion.

In some embodiments herein, process 200 and other processes incorporating at least some aspects thereof, offer a number of improvements, enhancements, and functionalities. Some such improvements, enhancements, and functionalities may include, but are not limited to, a capability to handle altitude-speed, distance-speed, altitude-distance constraints optimally; enable variable speed, flight path angle, and or thrust to minimize Direct Operating Cost; enable ride quality and performance constraints, including jerk and acceleration limits; account for winds aloft in the optimization; account for the actual engine performance as it deteriorates over time based on, for example, a personalized engine model; enable higher-order equations of motion (relative to other methods), including mass as a state variable by precluding the assumption of other methods that assume mass is constant; and enable the use of a cost index to define the cost of time and fuel in the cost functional, thereby enabling a process to minimize the direct operating cost.

In some embodiments, process 200 and at least one or more operations thereof may be extended to a full flight path optimization process. That is, in some embodiments and in accordance with other aspects disclosed herein, process 200 or parts thereof may be used in determining optimized flight paths for phases or portions of a flight path other than and/or in addition to the climb path such as, for example, the cruise path, the descent path, and combinations thereof.

In some embodiments, systems and devices such as a flight management system (FMS) may be designed, upgraded, retrofitted, expanded, and otherwise executed to implement one or more of the operations and processes disclosed herein to optimize flight guidance using nonlinear programming. In particular embodiments, operation 240 of process 200 may be performed by the FMS and/or other system(s). In some instances, a pilot or other aircraft responsible personnel may generate a flight path using one or more of the operations and processes disclosed herein. A flight path plan thus generated may subsequently be used as guidance in operating the aircraft. In some embodiments, the FMS and/or other system(s) may use one or more of the operations and processes disclosed herein to update a flight path plan for an aircraft in the instance operational conditions sufficiently change (i.e., greater than some minimal threshold) after an initial or previous flight path plan has been generated in accordance with processes herein. In some embodiments, process 200 and other methods, as well and the systems and devices disclosed herein may be applied to commercial (Part 25) aircraft.

Figure 3:
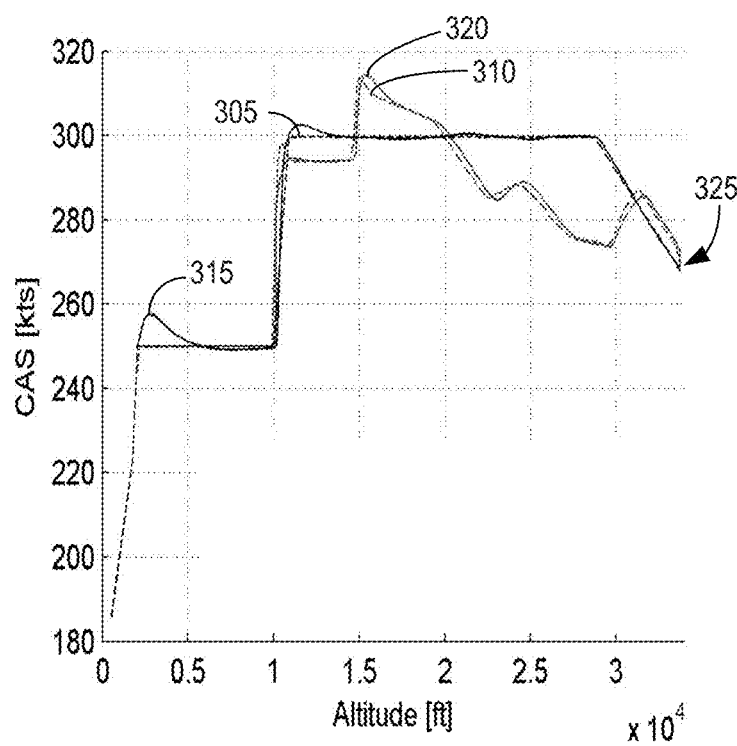
FIG. 3 is an illustrative graphical representation of an example flight trajectory and a legacy flight trajectory, in accordance with one or more embodiments shown or described herein.

FIG. 3 is an illustrative depiction of a graph 300 showing a plot for a climb path for an aircraft modeled in accordance with the present disclosure. In particular, a plot 305 for a prior/legacy plan is shown, wherein the aircraft is limited to maintaining a constant speed throughout the climb phase of the flight path. Plot 310 however is for a flight path plan incorporating aspects of the present disclosure where the aircraft is not limited or restricted to maintaining a constant speed throughout the climb phase of the flight path, in an effort to minimize fuel consumption. As shown, the calibrated airspeed (CAS) for the flight path plan 310 disclosed herein varies greatly as the aircraft climbs to the prescribed terminal altitude and speed, as indicated at point 325. It is noted that the trajectories for both the legacy plan and the current disclosure's plan both end at the same distance, altitude, and speed. Plots 315 and 320 depict a tracking result for the legacy plan and the current plan, respectively.

It is noted that applicant's of the present disclosure have realized improvements utilizing the processes disclosed herein. For example, modeling a Boeing 737-800 with CFM56 engines and using the processes disclosed herein, an optimal flight path was generated for prescribed operating scenarios. The generated flight path was flown using the modeled aircraft and engine combination and the fuel consumption was measured during the climb phase. The resulting fuel consumption was compared to the fuel consumed by the aircraft flying a legacy flight path having a constant speed optimization.

The processes disclosed herein, including but not limited to process 200 may be implemented by a system, application, or apparatus configured to execute the operations of the process. In some embodiments, various hardware elements of an apparatus, device or system execute program instructions to perform process 200. In some embodiments, hardwired circuitry may be used in place of, or in combination with, program instructions for implementation of processes according to some embodiments. Program instructions that can be executed by a system, device, or apparatus to implement process 200 (and other processes or portions thereof disclosed herein) may be stored on or otherwise embodied as non-transitory, tangible media. Embodiments are therefore not limited to any specific combination of hardware and software.

Figure 4:
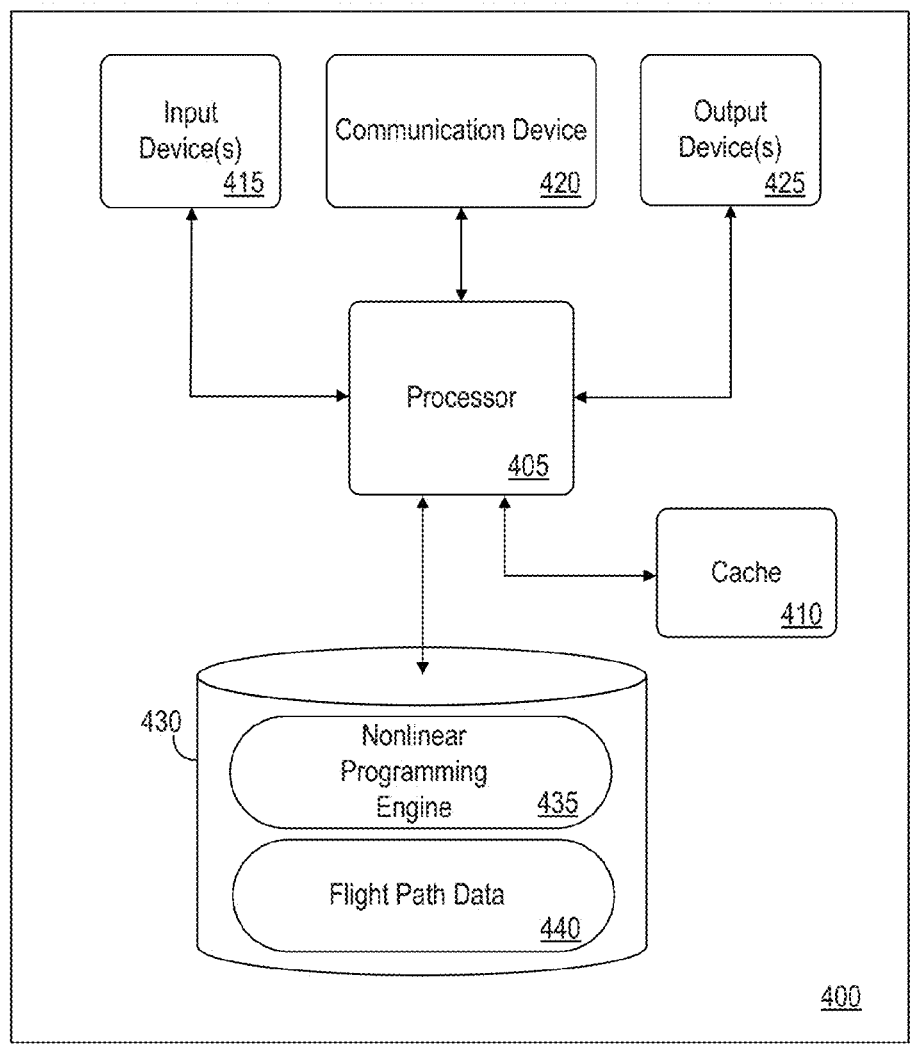
FIG. 4 is an illustrative depiction of a device, according to some embodiments herein.

FIG. 4 is a block diagram overview of a system or apparatus 400 according to some embodiments. System 400 may be, for example, associated with any of the devices described herein, including for example a FMS deployed in an aircraft, a ground-based system, and part of a service delivered via the "cloud". System 400 comprises a processor 405, such as one or more commercially available or custom-made Central Processing Units (CPUs) in the form of one-chip microprocessors or a multi-core processor, coupled to a communication device 420 configured to communicate via a communication network (not shown in FIG. 4) to another device or system. In the instance system 400 comprises a device or system deployed in an aircraft, communication device 420 may provide a mechanism for system 400 to interface with other on-board or remote applications, devices, systems, or services. System 400 may also include a cache 410, such as RAM memory modules. The system may further include an input device 415 (e.g., a touchscreen, mouse and/or keyboard to enter content) and an output device 425 (e.g., a touchscreen, a computer monitor to display, a LCD display).

Processor 405 communicates with a storage device 430. Storage device 430 may comprise any appropriate information storage device, including combinations of magnetic storage devices (e.g., a hard disk drive), optical storage devices, solid state drives, and/or semiconductor memory devices. In some embodiments, storage device 430 may comprise a database system, including in some configurations an in-memory database, a relational database, and other systems.

Storage device 430 may store program code or instructions 435 that may provide processor executable instructions for managing a flight path optimization generator, in accordance with processes herein. Processor 405 may perform the instructions of the program instructions 435 to thereby operate in accordance with any of the embodiments described herein. Program instructions 435 may be stored in a compressed, un-compiled and/or encrypted format. Program instructions 435 may furthermore include other program elements, such as an operating system, a database management system, and/or device drivers used by the processor 405 to interface with, for example, peripheral devices (not shown in FIG. 4). Storage device 430 may also include data 440 such as engine flight path data disclosed in some embodiments herein. Data 440 may be used by system 400, in some aspects, in performing one or more of the processes herein, including individual processes, individual operations of those processes, and combinations of the individual processes and the individual process operations.

All systems and processes discussed herein may be embodied in program code stored on one or more tangible, non-transitory computer-readable media. Such media may include, for example, a floppy disk, a CD-ROM, a DVD-ROM, a Flash drive, magnetic tape, and solid state Random Access Memory (RAM) or Read Only Memory (ROM) storage units. Embodiments are therefore not limited to any specific combination of hardware and software.

It is anticipated by this disclosure that additional parameters may be considered in the generation of an optimized flight path in addition to those specifically discussed by way of example herein. It is further anticipated that the disclosed aspects and embodiments including the use of nonlinear programming can sufficiently handle and process these other flight related parameters.

The embodiments described herein are solely for the purpose of illustration. Those in the art will recognize other embodiments which may be practiced with modifications and alterations.

What is claimed is:

1. A method of optimizing an operational flight path for a particular aircraft using nonlinear programming, the method comprising:
   receiving a mathematical model representation of performance characteristics for a particular aircraft and an engine combination, the mathematical model being applicable to at least one prescribed operating scenario and a representation of performance characteristics for the particular aircraft and engine combination including at least one of engine degradation characteristics, fuel burn as a function of flight variables, a flight dynamics model, and combinations thereof;
   performing a projection based model order reduction on the mathematical model representation for the particular aircraft and an engine combination;
   eliminating, based on the projected model, fast dynamics components of the mathematical model representation;
   determining a reduced order model, as a differential algebraic equation, wherein algebraic equations replace the fast dynamics;
   setting a flight path angle and a throttle lever angle as a control to minimize fuel consumption for the modeled aircraft and engine combination;
   defining a climb terminal cost as a function of cruise altitude and an airspeed;
   discretizing equations of motion for the modeled aircraft and engine combination and formulating optimization equations as a nonlinear programming problem;
   determining an optimal open loop control that minimizes fuel consumption for the modeled aircraft and engine combination to climb to a prescribed cruise altitude and airspeed corresponding to the at least one prescribed operating scenario;
   generating a flight path based on the determined optimal open loop control; and
   navigating, based on the generated flight path, the particular aircraft and an engine combination in one of the prescribed operating scenarios.

2. The method of claim 1, further comprising verifying the mathematical model representation of the performance characteristics for the aircraft and engine combination.

3. The method of claim 1, wherein the fast dynamics components of the mathematical model representation are eliminated by setting a pitch moment and vertical forces for the modeled aircraft and engine combination to equilibrium values.

4. The method of claim 1, further comprising determining a flight trajectory from the determined optimal open loop control and equations of motion for the modeled aircraft and engine.

5. The method of claim 1, wherein a climb speed (and thrust) for the modeled aircraft and engine combination to climb to the prescribed cruise altitude and airspeed is variable.

6. The method of claim 1, wherein the mathematical model representation of performance characteristics for the aircraft and engine combination comprises at least one of engine degradation characteristics, fuel burn as a function of flight variables, a flight dynamics model, and combinations thereof.

7. A non-transitory medium storing processor-executable program instructions, the medium comprising program instructions executable by a computer to:
   receive a mathematical model representation of performance characteristics for a particular aircraft and an engine combination, the mathematical model being applicable to at least one prescribed operating scenario and a representation of performance characteristics for the particular aircraft and engine combination including at least one of engine degradation characteristics, fuel burn as a function of flight variables, a flight dynamics model, and combinations thereof;
   perform a projection based model order reduction on the mathematical model representation;
   eliminate, based on the projected model, fast dynamics components of the mathematical model representation;
   determine a reduced order model, as a differential algebraic equation, wherein algebraic equations replace the fast dynamics;
   set a flight path angle and a throttle lever angle as a control to minimize fuel consumption for the modeled aircraft and engine combination;
   define a climb terminal cost as a function of cruise altitude and an airspeed;
   discretize equations of motion for the modeled aircraft and engine combination and formulate optimization equations as a nonlinear programming problem;
   determine an optimal open loop control that minimizes fuel consumption for the modeled aircraft and engine combination to climb to a prescribed cruise altitude and airspeed corresponding to the at least one prescribed operating scenario;
   generate a flight path based on the determined optimal open loop control; and
   navigate, based on the generated flight path, the particular aircraft and an engine combination in one of the prescribed operating scenarios.

8. The medium of claim 7, further comprising program instructions executable by a computer to verify the mathematical model representation of the performance characteristics for the aircraft and engine combination.

9. The medium of claim 7, wherein the fast dynamics components of the mathematical model representation are eliminated by setting a pitch moment and vertical forces for the modeled aircraft and engine combination to equilibrium values.

10. The medium of claim 7, further comprising program instructions executable by a computer to determine a flight trajectory from the determined optimal open loop control and equations of motion for the modeled aircraft and engine.

11. The medium of claim 7, wherein a climb speed (and thrust) for the modeled aircraft and engine combination to climb to the prescribed cruise altitude and airspeed is variable.

12. The medium of claim 7, wherein the mathematical model representation of performance characteristics for the aircraft and engine combination comprises at least one of engine degradation characteristics, fuel burn as a function of flight variables, a flight dynamics model, and combinations thereof.

13. A system comprising:
a computing device comprising:
  a memory storing processor-executable program instructions; and
  a processor to execute the processor-executable program instructions to cause the computing device to:
receive a mathematical model representation of performance characteristics for a particular aircraft and an engine combination, the mathematical model being applicable to at least one prescribed operating scenario and a representation of performance characteristics for the particular aircraft and engine combination including at least one of engine degradation characteristics, fuel burn as a function of flight variables, a flight dynamics model, and combinations thereof;
perform a projection based model order reduction on the mathematical model representation;
eliminate, based on the projected model, fast dynamics components of the mathematical model representation;
determine a reduced order model, as a differential algebraic equation, wherein algebraic equations replace the fast dynamics;
set a flight path angle and a throttle level angle as a control to minimize fuel consumption for the modeled aircraft and engine combination;
define a climb terminal cost as a function of cruise altitude and an airspeed;
discretize equations of motion for the modeled aircraft and engine combination and formulate optimization equations as a nonlinear programming problem; and
determine an optimal open loop control that minimizes fuel consumption for the modeled aircraft and engine combination to climb to a prescribed cruise altitude and airspeed corresponding to the at least one prescribed operating scenario;
generate a flight path based on the determined optimal open loop control; and
navigate, based on the generated flight path, the particular aircraft and an engine combination in one of the prescribed operating scenarios.

14. The system of claim 13, further comprising verifying the mathematical model representation of the performance characteristics for the aircraft and engine combination.

15. The system of claim 13, wherein the fast dynamics components of the mathematical model representation are eliminated by setting a pitch moment and vertical forces for the modeled aircraft and engine combination to equilibrium values.

16. The system of claim 13, further comprising determining a flight trajectory from the determined optimal open loop control and equations of motion for the modeled aircraft and engine.

17. The system of claim 13, wherein a climb speed (and thrust) for the modeled aircraft and engine combination to climb to the prescribed cruise altitude and airspeed is variable.

18. The system of claim 13, wherein the mathematical model representation of performance characteristics for the aircraft and engine combination comprises at least one of engine degradation characteristics, fuel burn as a function of flight variables, a flight dynamics model, and combinations thereof.

* * * * *